(12) United States Patent
Bosak et al.

(10) Patent No.: US 9,743,558 B2
(45) Date of Patent: Aug. 22, 2017

(54) AUTOMATIC HEIGHT COMPENSATING AND CO-PLANAR LEVELING HEAT REMOVAL ASSEMBLY FOR MULTI-CHIP PACKAGES

(71) Applicant: Intel Corporation, Santa Clara, CA (US)

(72) Inventors: Henry C. Bosak, Hillsboro, OR (US); Thomas A. Boyd, North Plains, OR (US); Harvey R. Kofstad, Vernonia, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/861,892

(22) Filed: Sep. 22, 2015

(65) Prior Publication Data

US 2016/0106003 A1 Apr. 14, 2016

Related U.S. Application Data

(60) Provisional application No. 62/063,527, filed on Oct. 14, 2014.

(51) Int. Cl.
*H01L 23/427* (2006.01)
*H05K 7/20* (2006.01)
(Continued)

(52) U.S. Cl.
CPC ......... *H05K 7/20509* (2013.01); *H01L 23/40* (2013.01); *H01L 23/4006* (2013.01);
(Continued)

(58) Field of Classification Search
CPC ... H01L 23/427; H01L 23/473; H01L 23/467; H01L 2225/06589; H01L 23/4006; H01L 2224/81825; H01L 2924/1432; H01L 2924/1531; H01L 2924/1434; H05K 7/20336; H05K 1/0203; H05K 7/20809; H05K 7/2039; H05K 7/20509; H05K 25/0655; H05K 23/40; H05K 23/3672
See application file for complete search history.

(56) References Cited

U.S. PATENT DOCUMENTS 4,138,692 A * 2/1979 Meeker ............... H01L 23/4332
165/80.4
4,729,060 A * 3/1988 Yamamoto .......... H01L 23/4332
165/80.4
(Continued)

FOREIGN PATENT DOCUMENTS

JP S6089946 A 5/1985
JP S61-90290 U 6/1986
(Continued)

*Primary Examiner* — Adam B Dravininkas
(74) *Attorney, Agent, or Firm* — Schwabe, Williamson & Wyatt, P.C.

(57) ABSTRACT

Embodiments of the present disclosure may include a heat removal assembly that is to thermally couple with two or more dice of an electronic device. The heat removal assembly may include a bellows to automatically adjust a position of at least one surface of the heat removal assembly relative to another surface of the heat removal assembly. Other embodiments may be described and/or claimed.

21 Claims, 11 Drawing Sheets

(51) Int. Cl.
  *H01L 23/40* (2006.01)
  *H01L 23/473* (2006.01)
  *H01L 25/065* (2006.01)
  *H01L 23/367* (2006.01)

(52) U.S. Cl.
  CPC .......... *H01L 23/427* (2013.01); *H01L 23/473* (2013.01); *H01L 25/0655* (2013.01); *H05K 7/20336* (2013.01); *H01L 23/3672* (2013.01); *H01L 2924/1432* (2013.01); *H01L 2924/1434* (2013.01); *H01L 2924/1531* (2013.01)

(56) References Cited

U.S. PATENT DOCUMENTS

| | | | | |
|---|---|---|---|---|
| 4,879,629 A * | 11/1989 | Tustaniwskyj | ...... | H01L 23/4006 257/E23.084 |
| 4,910,642 A * | 3/1990 | Downing | ............ | H01L 23/4332 165/908 |
| 4,951,740 A * | 8/1990 | Peterson | ............... | F28D 15/046 165/104.26 |
| 5,195,020 A * | 3/1993 | Suzuki | ................ | H01L 23/4332 257/714 |
| 5,206,791 A * | 4/1993 | Novotny | ............... | H01L 23/427 165/185 |
| 5,257,162 A * | 10/1993 | Crafts | .................... | H01L 23/04 165/185 |
| H001699 H * | 12/1997 | Vavrick | ................. | B29C 65/344 156/276 |
| 2003/0024698 A1* | 2/2003 | Bosak, III | ............. | H01L 23/367 165/185 |
| 2003/0173064 A1* | 9/2003 | Ueki | .................... | F28D 15/0233 165/104.21 |
| 2004/0052052 A1* | 3/2004 | Rivera | .................. | H01L 23/427 361/700 |
| 2004/0074630 A1* | 4/2004 | Sen | ....................... | H01L 23/433 165/46 |
| 2007/0047146 A1* | 3/2007 | Biskeborn | ............ | G11B 5/4893 360/240 |
| 2007/0146996 A1* | 6/2007 | Herring | ................. | H01L 23/427 361/700 |
| 2008/0053640 A1* | 3/2008 | Mok | ....................... | F28D 15/02 165/104.33 |
| 2010/0326630 A1* | 12/2010 | Wang | .................. | F28D 15/0233 165/104.26 |
| 2014/0090816 A1* | 4/2014 | Yang | ..................... | H01L 23/427 165/104.26 |

FOREIGN PATENT DOCUMENTS

| | | |
|---|---|---|
| JP | 61151395 A | 9/1986 |
| JP | S6419754 A | 1/1989 |
| JP | H01-259599 A | 10/1989 |
| JP | H2-95248 U | 7/1990 |
| JP | H05-327257 A | 12/1993 |
| JP | H07245362 A | 9/1995 |
| JP | 2000065490 A | 3/2000 |
| JP | 2014013849 A | 1/2014 |

* cited by examiner

AUTOMATIC HEIGHT COMPENSATING AND CO-PLANAR LEVELING HEAT REMOVAL ASSEMBLY FOR MULTI-CHIP PACKAGES

CROSS-REFERENCE TO PRIOR APPLICATIONS

The present application claims priority under 35 U.S.C. §119(e) to U.S. Provisional Patent Application No. 62/063,527 entitled "AUTOMATIC HEIGHT COMPENSATING AND CO-PLANAR LEVELING VAPOR CHAMBER DESIGN FOR MULTI CHIP PACKAGES" and filed Oct. 14, 2014, the entire disclosure of which is incorporated herein by reference.

TECHNICAL FIELD

The present disclosure relates generally to the field of packages for electronic devices, and more specifically to configurations of heat removal assemblies.

BACKGROUND

Legacy solutions to cool multi-chip packages may have required an individual heat removal assembly or individual heatsink for each target device or die that the heat was being removed from. This need may have been amplified if the different die in the target device had different z-heights as measured from the substrate to which the dice were attached. In this case, the heat removal assembly may have had difficulty making solid contact with a die that had a lower z-height than another die, and so individual heat removal assemblies may have been needed to account for the different z-heights of the difference dice.

However, separate heat removal assemblies or heatsinks may have resulted in limits to the total amount of power or heat that could be dissipated from the entire module assembly, or each device. Additionally, the use of multiple assemblies may have resulted in an increase in the size or footprint of the total heat removal structures, which may have been undesirable in devices where small size or a small footprint was desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
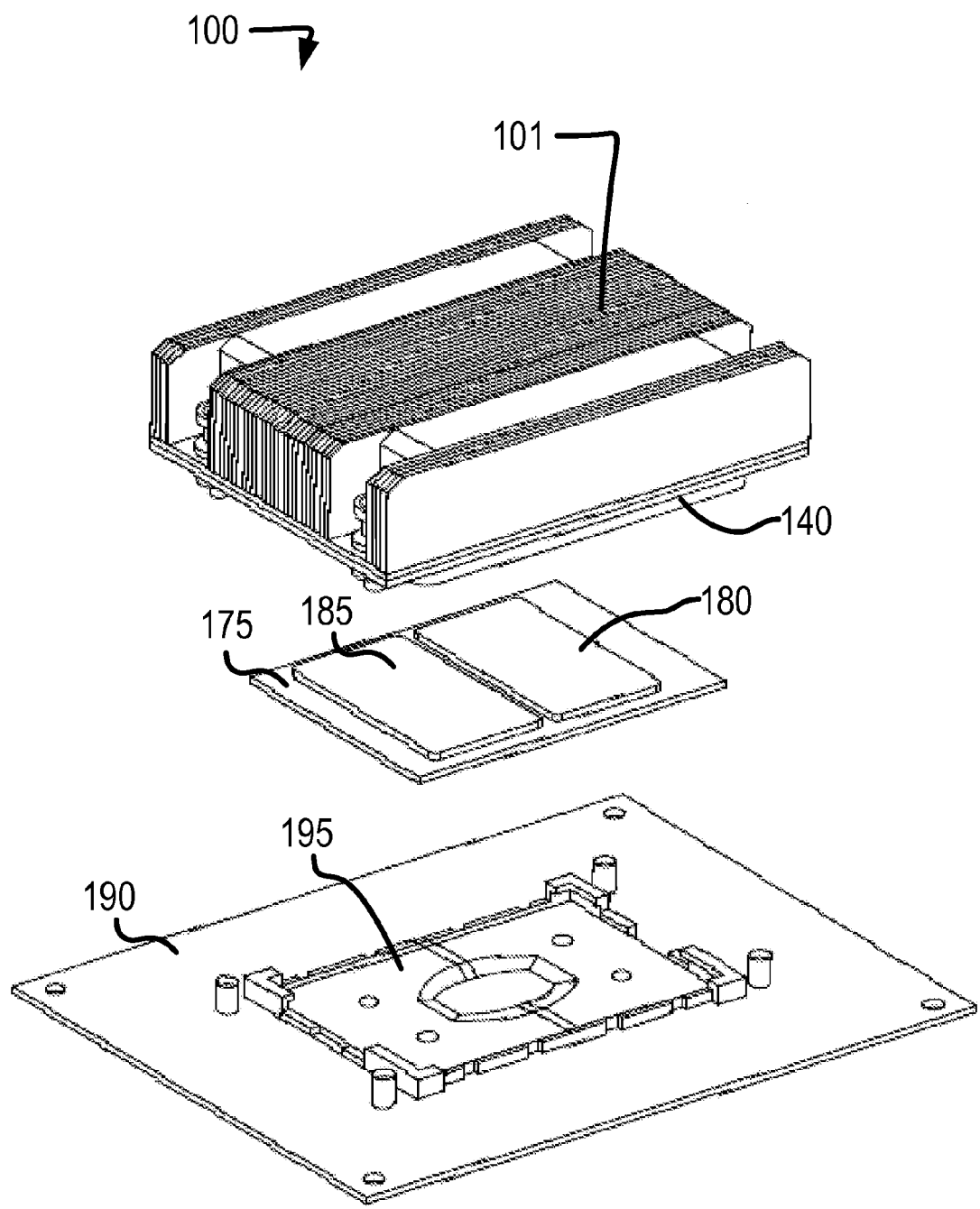
FIG. 1 schematically illustrates an exploded view of a package that includes a heat removal assembly, in accordance with various embodiments.

Embodiments of the present disclosure may include a heat removal assembly that is to thermally couple with two or more dice of an electronic device. The heat removal assembly may include a bellows to automatically adjust a position of at least one surface of the heat removal assembly relative to another surface of the heat removal assembly. In embodiments, the heat removal assembly may be a cold plate assembly or a vapor chamber. In embodiments, the heat removal assembly may include a spring assembly such as one or more coil springs and/or one or more leaf springs to adjust the bellows. Generally, some embodiments may be related to an integrated heat spreader (IHS). Alternative embodiments may be related to a heatsink base. Still other embodiments may be related to some other type of heat removal assembly.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

As noted above, some legacy heat removal solutions used in MCPs may have been to use an individual heat removal assembly or heatsink for each target device from which heat is removed. However, one major drawback of this type of solution may have been that the total amount of power that could be dissipated from the entire module assembly or from each device may have been limited. The heat removal assemblies of the present disclosure may allow provision of one heat removal assembly that removes heat from "n" number of devices in the same footprint (e.g., a same MCP), and may allow for more flexibility in power dissipation from device to device.

Specifically, embodiments of the present disclosure may provide automatic height compensating surfaces for target devices utilizing vapor chamber base technology. Each device may share a same heatsink, yet due to the automatic height compensation in a component of a heat removal assembly such as a vapor chamber base of a vapor chamber, Thermal Interface Material (TIM) bondline thickness may be minimized while providing the necessary pressure to each TIM/package interface. This technology can apply to bare die MCPs, MCPs with multiple heat removal assemblies or any hybrid. In some embodiments, the automatic height compensation techniques and configurations described herein may be applied to any type of suitable device such as, for example, a central processing unit (CPU), stacked memory, system on chip (SoC), etc. In some embodiments, techniques and configurations described herein may be used in connection with field-programmable gate array (FPGA) devices.

As an additional benefit, some legacy heat removal assemblies used in multi-chip packages (MCPs) may have suffered from a problem of making good contact with typically the tallest die, then using thick Thermal Interface Material (TIM 1) to make the thermal connection from the top of the die (dice) to the heat removal assembly. This may result in a less than optimal thermal solution and can limit product offerings. A heat removal assembly such as a vapor chamber according to the present disclosure may be applied at the integrated heat spreader (IHS) level (package level for MCPs). For example, "n" number of automatic height and co-planar adjusting "bellows" can be used to make contact with each die surface, which may minimize TIM 1 thickness, and also provide for co-planarity.

Self-adjusting bellows coupled with springs may ensure optimal mating (minimum TIM 1 bondline thickness) between the vapor chamber and the die (dice). In some embodiments, the design may employ use of a single phase liquid as the heat removal medium, and the heat removal assembly may include an inlet and outlet for the liquid.

One solution may be to add "steps" into the heat removal assembly (where possible) in order to minimize the TIM 1 interface thickness. However, such solution may not be an optimal solution, and large variability may minimize its thermal capability. The vapor chamber or other IHS of the present disclosure may always make contact with its target die and minimize TIM 1 thickness, hence reducing thermal resistance compared to current designs.

Embodiments herein will generally be described in terms of heat removal assemblies. Generally, a heat removal assembly may include an IHS such as a vapor chamber, a cold plate, or some other type of IHS. The heat removal assembly may also include a heatsink coupled with the IHS. As used herein, an IHS may refer to a device that is configured to couple with a discrete device such as a die and spread heat from the dice to a larger surface area. The IHS may then couple with a heatsink as described elsewhere herein which may then transfer the thermal energy from the die/dice/IHS.

As used herein, a vapor chamber may refer to an IHS assembly that is filled with coolant molecules that change phases as they are heated. Specifically, when the coolant is heated, it may vaporize. The vaporized coolant may then be distributed throughout the chamber. The coolant may then condense on cold surfaces, dissipate its heat load, and be channeled back to the coolant reservoir.

An alternative type of IHS may be a cold plate, wherein the IHS is filled with a liquid that is introduced on one side of the IHS, and exits on another side of the IHS. The liquid may flow through the IHS and absorb thermal energy, whereupon it exits the IHS and removes the thermal energy from the system.

FIG. 1 schematically illustrates an exploded view of a package that includes a heat removal assembly 100, in accordance with various embodiments. Specifically, the package may be an MCP and FIG. 1 depicts an MCP that includes a heat removal assembly 100. The heat removal assembly 100 may include a heatsink 101 that is coupled with a vapor chamber 140. The heat removal assembly 100 may be configured to couple with a substrate 175 that includes a first die 180 and a second die 185. The die 180 and 185 may have different z-heights as measured from the substrate 175 towards the heat removal assembly 100, as will be discussed in greater detail below. The substrate 175 with the die 180 and 185 may be configured to couple with a socket 195 of a substrate 190. The substrate 190 may be, for example, a printed circuit board (PCB) or some other type of substrate.

Figure 2:
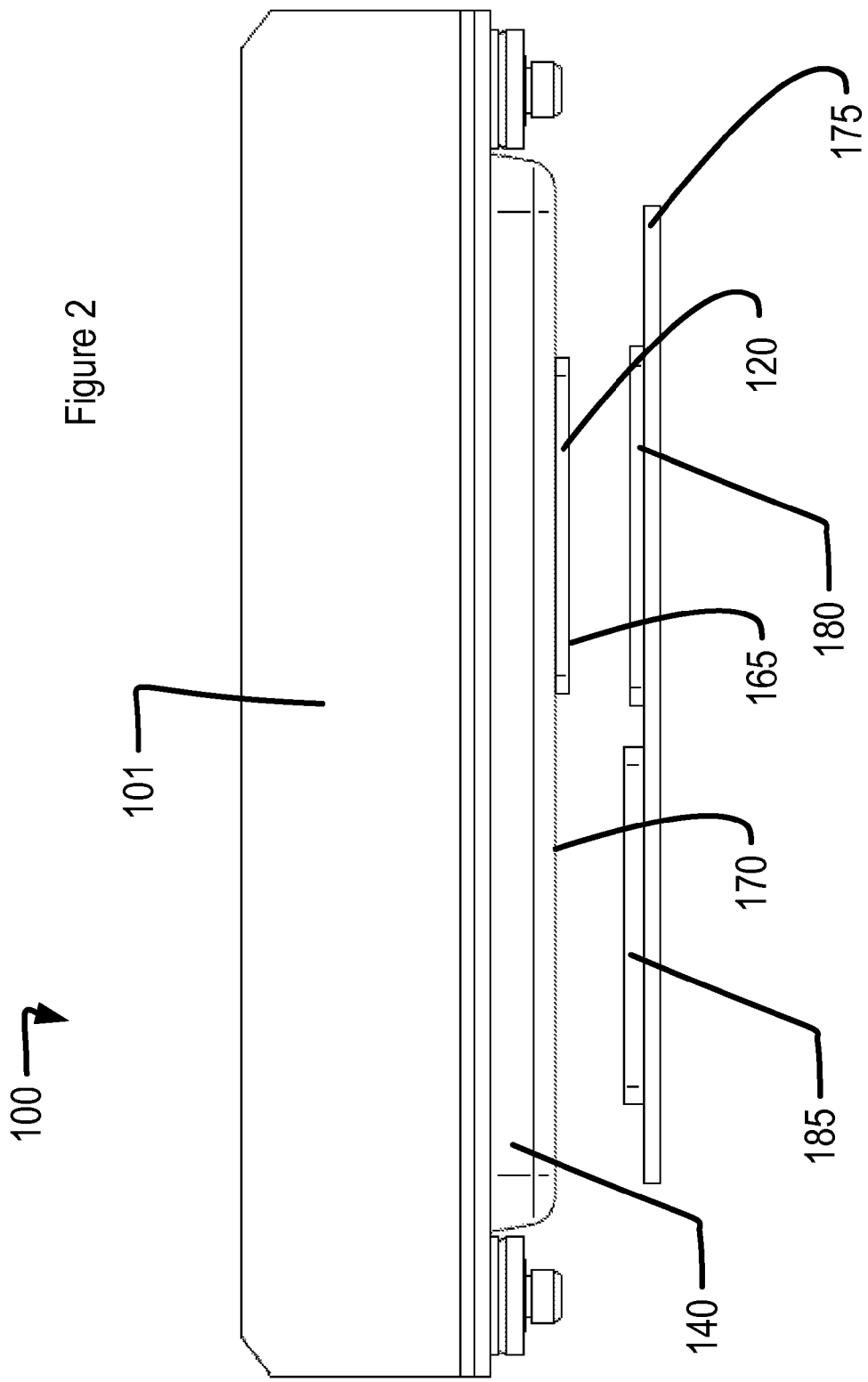
FIG. 2 is a side view of the heat removal assembly and dice of FIG. 1, in accordance with various embodiments.

FIG. 2 is a side view of the heat removal assembly 100 and dice 180 and 185 of FIG. 1, in accordance with various embodiments. Specifically, FIG. 2 depicts the heat removal assembly 100 that may include the heatsink 101 and vapor chamber 140. The heat removal assembly 100 may be configured to couple with dice 180 and 185. As described above, the dice 180 and 185 may be, for example, a CPU, stacked memory, an SoC, etc.

The heatsink 101 may be a heatsink made of a material such as aluminum, copper, diamond, a composite material, a ceramic, or some other combination or alloy thereof. In embodiments, the heatsink 101 may be a solid block of material, while in other embodiments the heatsink 101 may include fins to maximize the surface area of the heatsink. In some embodiments the heatsink 101 may be thermally coupled with a device such as a fan that is configured to move a liquid or air over the heatsink 101.

As shown in FIG. 2, the dice 180 and 185 may have different z-heights as measured from substrate 175. Specifically, as shown die 185 may have a higher z-height, that is be taller as measured from substrate 175, than die 180.

To accommodate the different z-heights of the dice 180 and 185, the heat removal assembly may be configured such that the surfaces 165 and 170 that are to couple with the dice 180 and 185, respectively, have a different position from one another such that they are not co-planar with one another. Specifically, as shown in FIG. 2, the surface 165 may extend farther from the vapor chamber 140 than the surface 170. By extending farther, the surface 165 may be able to form a better contact with die 180, which has a lower z-height, than if the surface 165 was co-planar with surface 170. To accommodate this extension, surface 170 may be a surface of the vapor chamber 140 assembly, while surface 165 may be a surface of a bellows lower stiffener 120 that extends from the vapor chamber 140.

Figure 3:
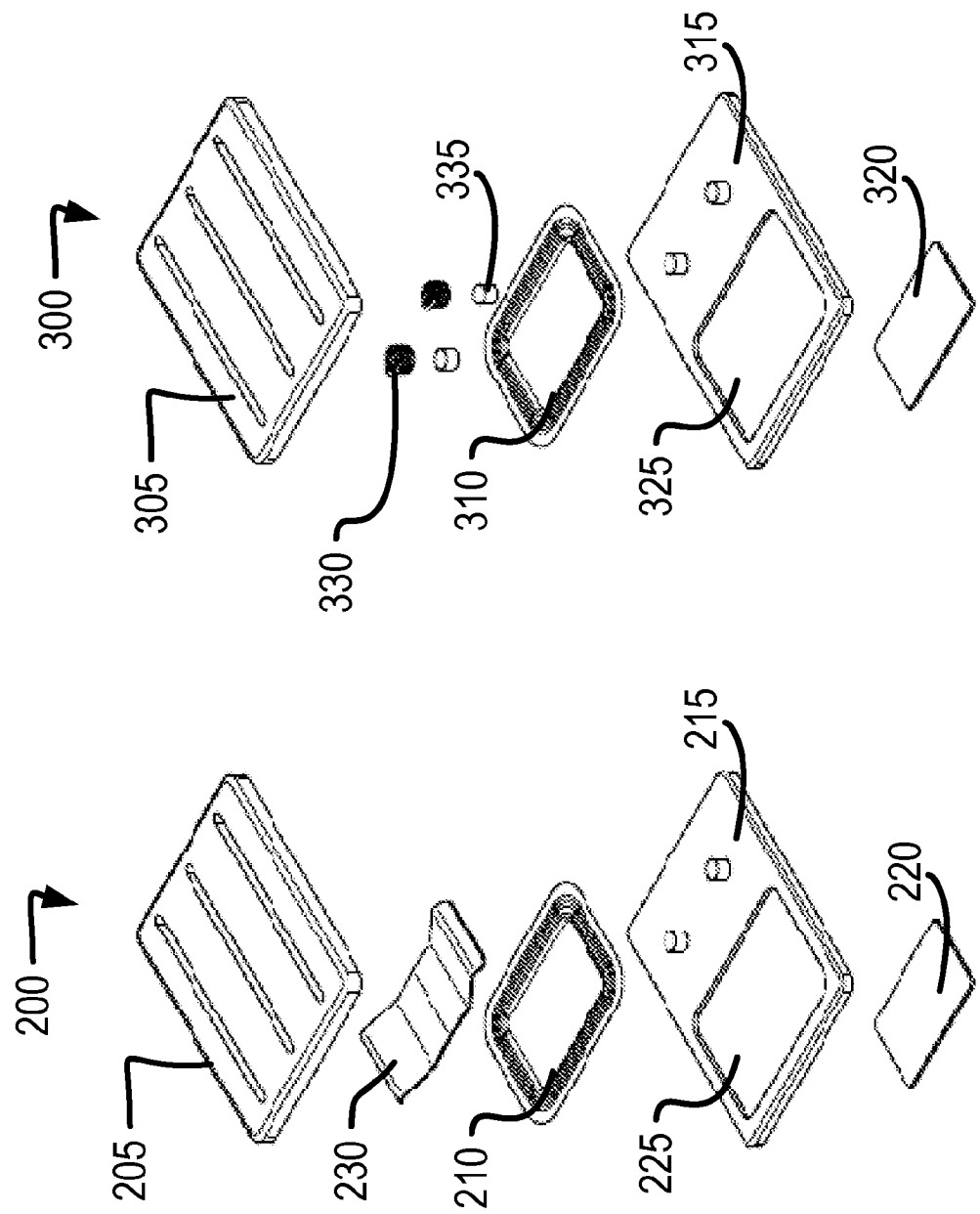
FIG. 3 is an exploded view of two different heat removal assemblies, in accordance with various embodiments.

FIG. 3 is an exploded view of two different heat removal assemblies 200 and 300, in accordance with various embodiments. Specifically, the heat removal assemblies 200 and 300 may be similar to heat removal assembly 100. The heat removal assemblies 200 and 300 may include a cover 205/305, which may be configured to directly couple with a heatsink such as heatsink 101. The cover 205/305 may be constructed of, for example, copper, aluminum, and/or some other thermally conductive material. The cover 205/305 may be coupled with a base 215/315 that may include a cutout 225/325. The base 215/315 may be constructed of, for example, copper, aluminum, and/or some other thermally conductive material. The cover 205/305 and the base 215/315 may generally be opposite sides of a vapor chamber such as vapor chamber 140.

A bellows 210/310 may be positioned within the cutout 225/325. In embodiments, the bellows 210/310 may be constructed of copper, aluminum, and/or some other thermally conductive material and be configured to flex as pressure is applied to the bellows 210/310 from within the vapor chamber. The bellows 210/310 may be coupled with a relatively structurally solid bellows lower stiffener 220/320 which may be similar, for example, to bellows lower stiffener 120. In embodiments, the bellows lower stiffener 220/320 may be constructed of copper, aluminum, and/or some other thermally conductive material. The bellows lower stiffener 220/320 may be used if it is desirable for the bellows 210/310 to extend a relatively even amount away from the base 215/315. In other words, if it is desirable for the extended portion of the heat removal assembly to be relatively planar rather than bowed or arced. As shown, the bellows lower stiffener 220/320 may be on an opposite side of the base 215/315 than the bellows 210/310. In other embodiments, the bellows 210/310 and bellows lower stiffener 220/320 may be on the same side of the base 215/315. In some embodiments, the bellows lower stiffener 220/320 may be separate and removable from the bellows 210/310, while in other embodiments the bellows lower stiffener 220/320 and the bellows 210/310 may be at least partially or wholly coupled to one another, for example, by an adhesive, laminate, or some other type of bonding agent.

In embodiments, the heat removal assembly 200 may include a spring assembly such as a leaf spring 230 that is positioned between the cover 205 and the bellows 210. The leaf spring 230 may be configured to push against the relatively solid cover 205 and thereby exert pressure against the bellows 210, which in turn may cause the bellows 210 to extend from the heat removal assembly 200. As discussed above, an example of this extension is shown in FIG. 1 with respect to heat removal assembly 100 and bellows lower stiffener 120 such that surface 165 and 170 are not co-planar.

Similarly, in embodiments, the heat removal assembly 300 may include a spring assembly such as a coil spring 330 that may also be positioned around a pin 335. The coil spring 330 may be configured to push against the cover 305 and exert pressure against the bellows 310, thereby extending the bellows 310 from the heat removal assembly 300 as described above. The pin 335 may be configured to provide structural support for the coil spring 330. In some embodiments, the pin 335 may also act to keep the bellows 310 from contracting beyond a desired amount.

In some embodiments, the spring constants of the leaf spring 230 and the coil spring 330 may be based on pre-defined manufacturing tolerances. For example, it may be known that a specific heat removal assembly may be used for a certain application where it is desirable for a bellows to extend a certain amount and exert a known amount of pressure. Based on these parameters, the spring constants of the leaf spring 230 and/or coil springs 330 may be identified and the heat removal assemblies 200 and 300 may be manufactured to accommodate these parameters. In other embodiments, the spring constants of the leaf spring 230 or the coil springs 330 may be based on more or fewer parameters than those described above. Also, in some embodiments, although only a single leaf spring 230 and two coil springs 330 are depicted, in other embodiments a heat removal assembly may have multiple leaf springs, more or fewer coil springs, or some combination thereof.

Figure 4:
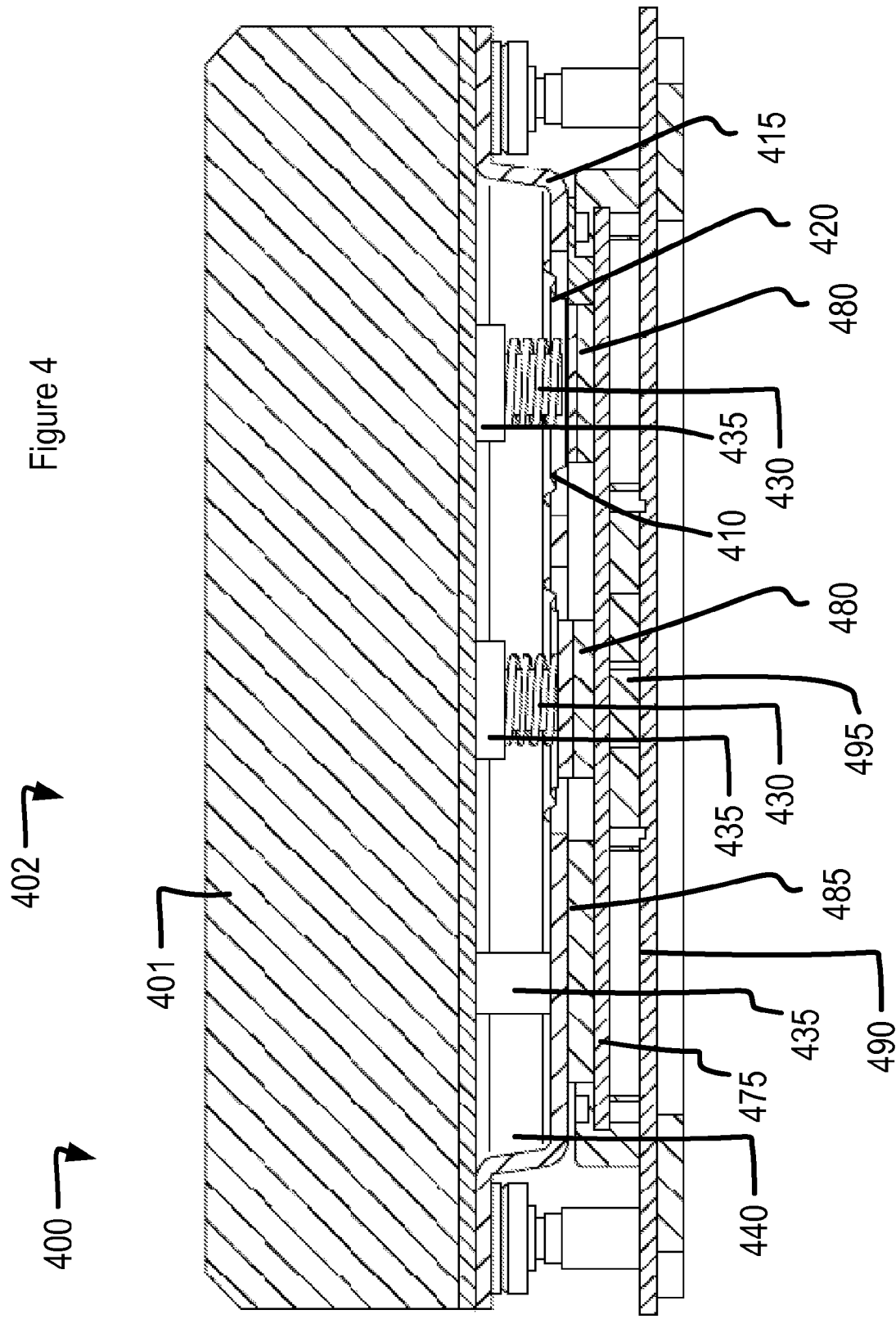
FIG. 4 is a cut-away view of a multi-chip package (MCP) that includes a heat removal assembly, in accordance with various embodiments.

FIG. 4 is a cut-away view of an MCP 402 that includes a heat removal assembly 400, in accordance with various embodiments. Generally, the heat removal assembly 400 may be similar to heat removal assembly 100 or 300. Specifically, the heat removal assembly 400 may include a heatsink 401, which may be similar to heatsink 101. The heat removal assembly 400 may be coupled with a socket 495 disposed on a substrate 490, which may be similar to socket 195 and substrate 190. As shown in FIG. 4, the socket 495 may be coupled with a substrate 475 that includes a plurality of dice 485 and 480, which may be respectively similar to substrate 175 and dice 185 and 180. As shown in FIG. 4, the MCP 402 may include a total of three dice; however, as noted above other MCPs may include more or fewer dice. Three dice are depicted herein as one example. The heat removal assembly 400 may be coupled with the dice 485 and 480 as shown.

The heat removal assembly 400 may include a vapor chamber 440, which may be similar to vapor chamber 140. Specifically, the vapor chamber 440 may include a cover, which may be similar to cover 305. However, the cover in FIG. 4 is not explicitly enumerated to avoid un-necessary cluttering of the Figure. The vapor chamber 440 may further include a base 415, which may be similar to base 315.

A plurality of pins 435, which may be similar to pins 335, may be disposed within the vapor chamber 440. As shown in FIG. 4, at least some of the pins 435 may be surrounded by a coil spring 430, which may be similar to coil spring 330. The pins 435 that are surrounded by the coil springs 430 may be further coupled with a bellows 410, which may be similar to bellows 310. The bellows 410 may be coupled with a lower stiffener 420, which may be similar to lower stiffener 320.

In some embodiments, the vapor chamber 440 may include a pin 435 that is not coupled with a bellows or surrounded by a coil spring, as shown by the pin 435 at the left-most side of FIG. 4. In embodiments, the extra pin may assist with structural support of the vapor chamber 440, that is provide structural support between the cover and the base 415 of the vapor chamber 440.

As shown in FIG. 4, the dice 480 may have a lower z-height, as measured from the substrate 490, than die 485. In this embodiment, the die 485 may be directly coupled with the base 415. However, the die 480, which may have the lower z-height, may be coupled with the lower stiffener 420 which may at least partially extend from the base 415 in the direction of the dice 480. In this manner, the heat removal assembly 400 may be configured to sufficiently couple with the dice 480 and 485, which may have different z-heights, and remove heat from both of the dice 480 and 485 without the need for a relatively large TIM 1 material placed between the dice 480 and the heat removal assembly 400. Additionally, as shown in FIG. 4, multiple dice 480 with different z-heights may be able to be coupled with a single heat removal assembly 400, rather than requiring individual heat removal assemblies for dice with different z-heights.

It will be understood that the embodiment depicted in FIG. 4 is merely one embodiment, and in other embodiments the heat removal assembly 400 may be similar to heat removal assembly 200 and include, for example, a leaf spring such as leaf spring 230 rather than pins 335 and/or coil spring 330. In some embodiments, both a leaf spring and a coil spring may be used. Additionally, the heat removal assembly 400 may be configurable to accommodate more than two z-heights, dependent on the tuning of the spring constants of the various springs of the heat removal assembly 400.

Figure 5:
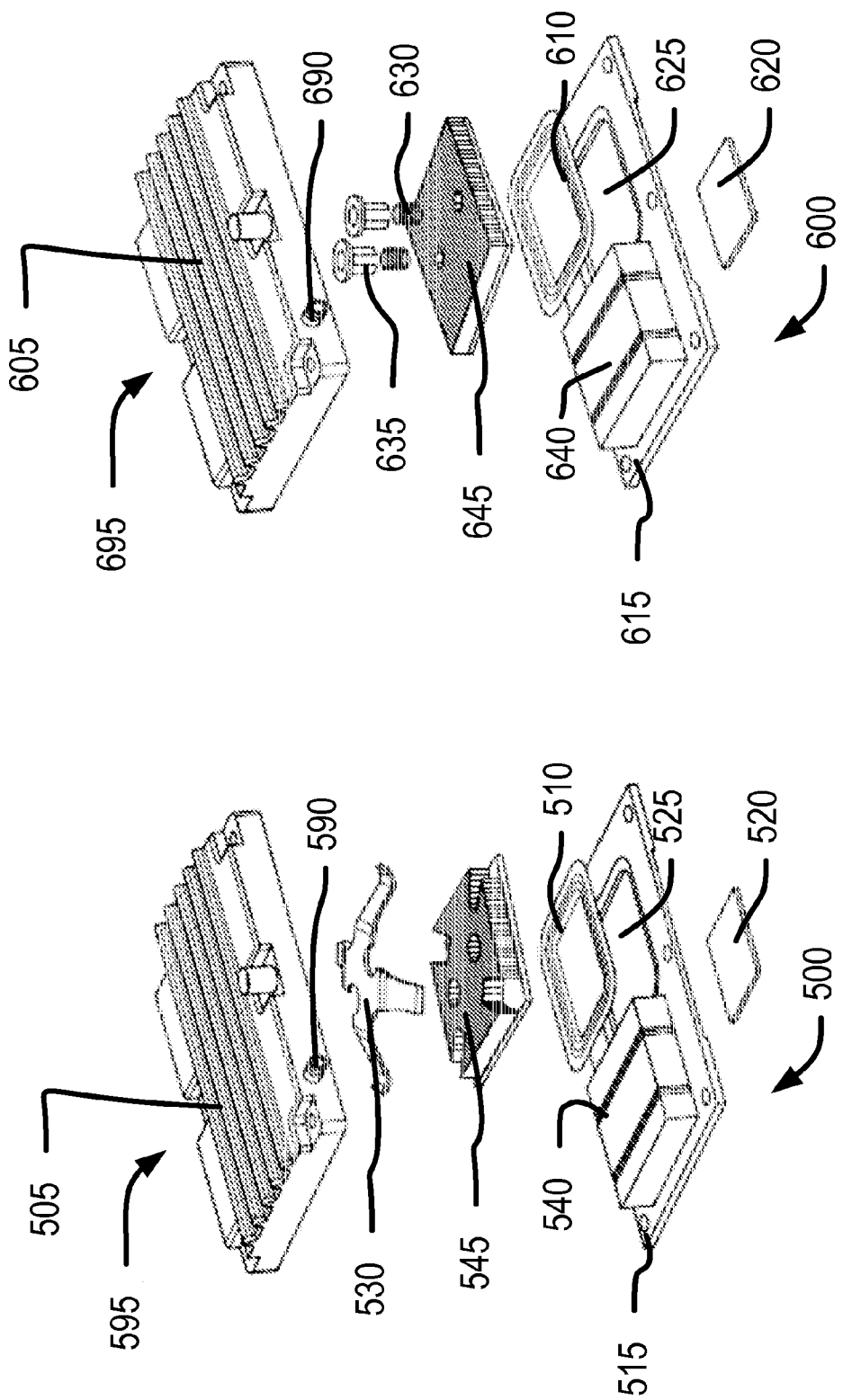
FIG. 5 is an exploded view of two different heat removal assemblies, in accordance with various embodiments.

FIG. 5 is an exploded view of two different heat removal assemblies 500 and 600, in accordance with various embodiments. Specifically, the heat removal assemblies 500 and 600 may be similar to heat removal assemblies 200 and 300. However, the heat removal assemblies 200 and 300 may be based on a cold plate configuration, such as the cold plate described above, rather than a vapor chamber configuration.

The heat removal assemblies 500 and 600 may include a bellows stiffener 520/620, a base 515/615 with a cutout 525/625, and a bellows 510/610, which may be respectively similar to bellows stiffener 220/320, base 215/315, cutout 225/325, and bellows 210/310. Heat removal assembly 500 may further include a leaf spring 530, which may be similar to leaf spring 230. Heat removal assembly 600 may further include one or more pins 635 and coil springs 630, which may be respectively similar to pins 335 and coil springs 330. The heat removal assembly 500/600 may further include an input port 590/690 and an outlet port 595/695, through which cooling fluid may enter and exit the heat removal assembly 500/600, respectively. Specifically, the cooling fluid may enter the heat removal assembly 500/600 at input port 590/690, flow through the heat removal assembly 500/600 where it absorbs thermal energy, and then exit the heat removal assembly 500/600 at output port 595/695, thereby discarding the thermal energy from the system.

Heat removal assembly 500 may further include a cover 505, which may be similar to cover 205. However, the cover 505 may include one or more grooves or fins as shown which may help to increase the surface area of the cover 505 such that it may distribute an increased amount of heat from the liquid contained within the heat removal assembly 500.

Similarly the base 515 may be coupled with cold plate fins 540. Other cold plate fins 545 may be positioned between the leaf spring 530 and the bellows 510. Generally, the cold plate fins 540 and 545 may be configured to direct the flow of fluid through the heat removal assembly 500. The cold plate fins 540 and 545 may proscribe that path that the fluid may follow through the heat removal assembly 500, and serve to increase the amount of thermal energy that the fluid absorbs. The cold plate fins 540 and 545 may further serve to reduce or eliminate "hot spots" that may occur in the heat removal assembly 500 due to the fluid not being evenly distributed throughout the heat removal assembly 500.

It will be noted that the leaf spring 530 may have four "arms," while the leaf spring 230 of heat removal assembly 200 may only have two "arms." Further, leaf spring 530 may be depicted as inverted with respect to leaf spring 230. These differences are merely examples of various configurations, and in some embodiments heat removal assemblies 200 or 500 may have a leaf spring that includes a different number of arms, or is in a different configuration, than shown. As specifically shown in FIG. 5, the leaf spring 530 may be configured to overlay, and exert pressure against, the cold plate fins 545 as will be explained in greater detail below.

Heat removal assembly 600 may additionally have a cover 605, which may be similar to cover 505. Heat removal assembly 600 may also include cold plate fins 640 which may be similar to cold plate fins 540. Heat removal assembly 600 may also include cold plate fins 645, which may be similar to cold plate fins 545. However, as depicted, cold plate fins 645 may have a different shape than cold plate fins 545, because cold plate fins 645 may not need to be configured to accommodate the arms of leaf spring 530.

Figure 6:
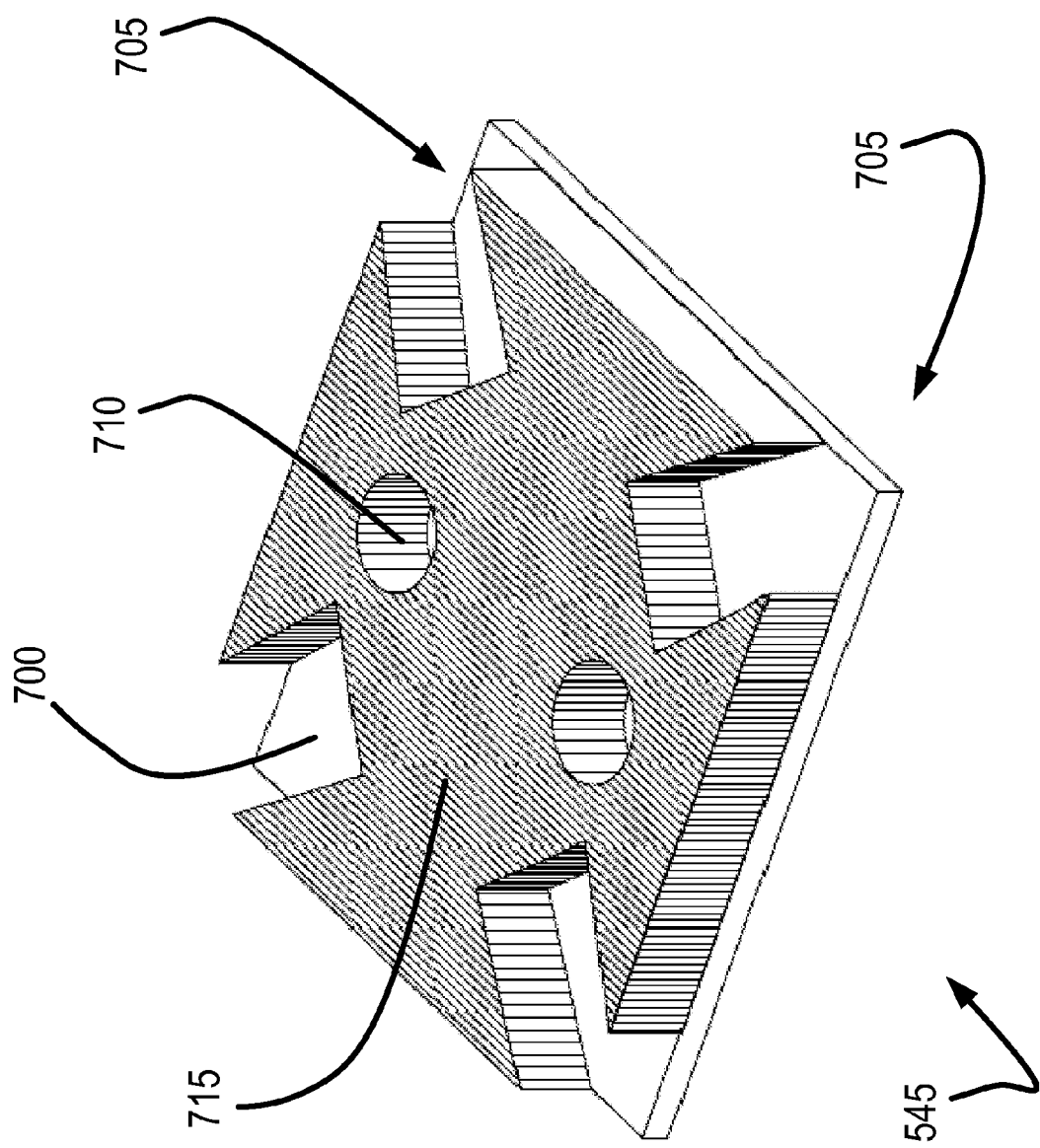
FIG. 6 depicts example cold plate fins that could be used in a heat removal assembly of FIG. 5, in accordance with various embodiments.

FIG. 6 depicts the cold plate fins 545 of heat removal assembly 500, in accordance with various embodiments. As depicted, the cold plate fins 545 may include a relatively solid plate 700, which may be copper, aluminum, and/or some other thermally conductive material. The cold plate fins 545 may include a fin material 715 which may be at least partially ridged as shown, and which may help direct the flow of fluid through the heat removal assembly 500. In embodiments, the fin material 715 may include copper, aluminum, and/or some other thermally conductive material. In some embodiments, the cold plate fins 545 may include various features that may direct the fluid and/or increase the surface area of the cold plate fins 545 to dissipate heat to the cooling fluid. For example, the fins of the cold plate fins 545 may be parallel, may include pin features, and/or other protrusions from a relatively solid base.

The cold plate fins 545 may further include one or more cutouts 705, which may allow the cold plate fins 545 to mate with the arms of the leaf spring 530 such that the leaf spring 530 can exert pressure against the solid plate 700. As depicted in FIGS. 5 and 6, the cold plate fins 545 may include four cutouts 705, while in other embodiments the cold plate fins 545 may include more or fewer cutouts. The number of cutouts may be dependent on the configuration of the leaf spring 530, or on some other characteristics of the heat removal assembly 500.

In some embodiments, the cold plate fins 545 may also include one or more holes such as holes 710 which may be configured to receive or mate with a pin, screw, or some type of stop post to help hold the cold plate fins 545 and/or the leaf spring 530 in position within the heat removal assembly 500.

Figure 7:
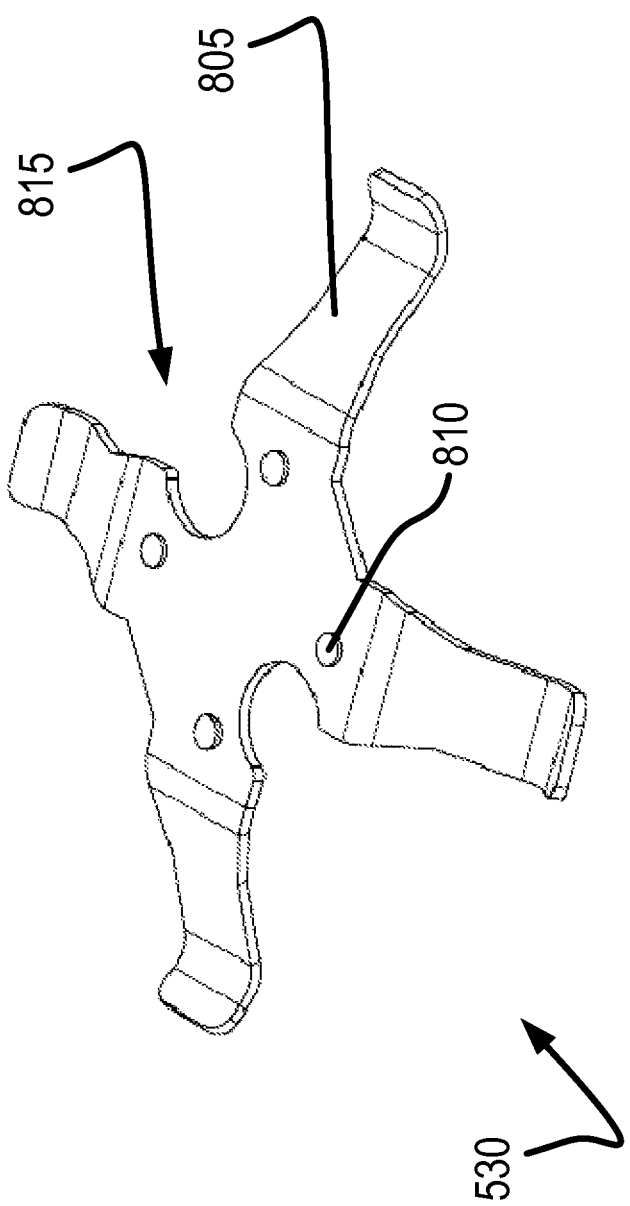
FIG. 7 depicts an example spring that could be used in a heat removal assembly of FIG. 5, in accordance with various embodiments.

FIG. 7 depicts a close-up view of leaf spring 530 of FIG. 5, in accordance with various embodiments. Leaf spring 530 may include a plurality of arms 805, which may be configured to mate with cold plate fins 545, and particularly cutouts 705 of cold plate fins 545, as explained above. The leaf spring 530 may additionally include one or more cutouts 815, which may generally align with holes 710 of cold plate fins 545. Similarly to the holes 710 of fluid director 545, the cutouts 815 may be configured to receive or mate with a pin, screw, or some other type of stop post to help hold the leaf spring 530 in position within the heat removal assembly 500. In embodiments, the leaf spring 530 may also include one or more half shears 810, as depicted. The half shears 810 may at least partially extend from the leaf spring 530, as will be explained in further detail below.

In some embodiments, a leaf spring may be used in a heat removal assembly that includes a vapor chamber, for example, heat removal assembly 100. In some embodiments, the presence of the leaf spring against the bellows may interfere with the performance of the vapor chamber. Specifically, the leaf spring may be pressed against the bellows, and therefore the coolant of the vapor chamber may not be able to come in contact with the bellows, and therefore absorb the thermal energy of a die such as die 180.

In some embodiments, a wicking material may be positioned between the bellows and the leaf spring. For example, a wicking material may be useful in the vapor chambers of heat removal assemblies 100, 200, 300, 400, or some other heat removal assembly described herein.

Generally, the wicking material may include a fine wire mesh, a sintered powder, or some other type of wicking material. Embodiments herein will generally be described with reference to a wire mesh for ease of description, but it will be understood that other embodiments may include some other type of wicking structure and/or material that may be used for vapor chamber designs.

Figure 8:
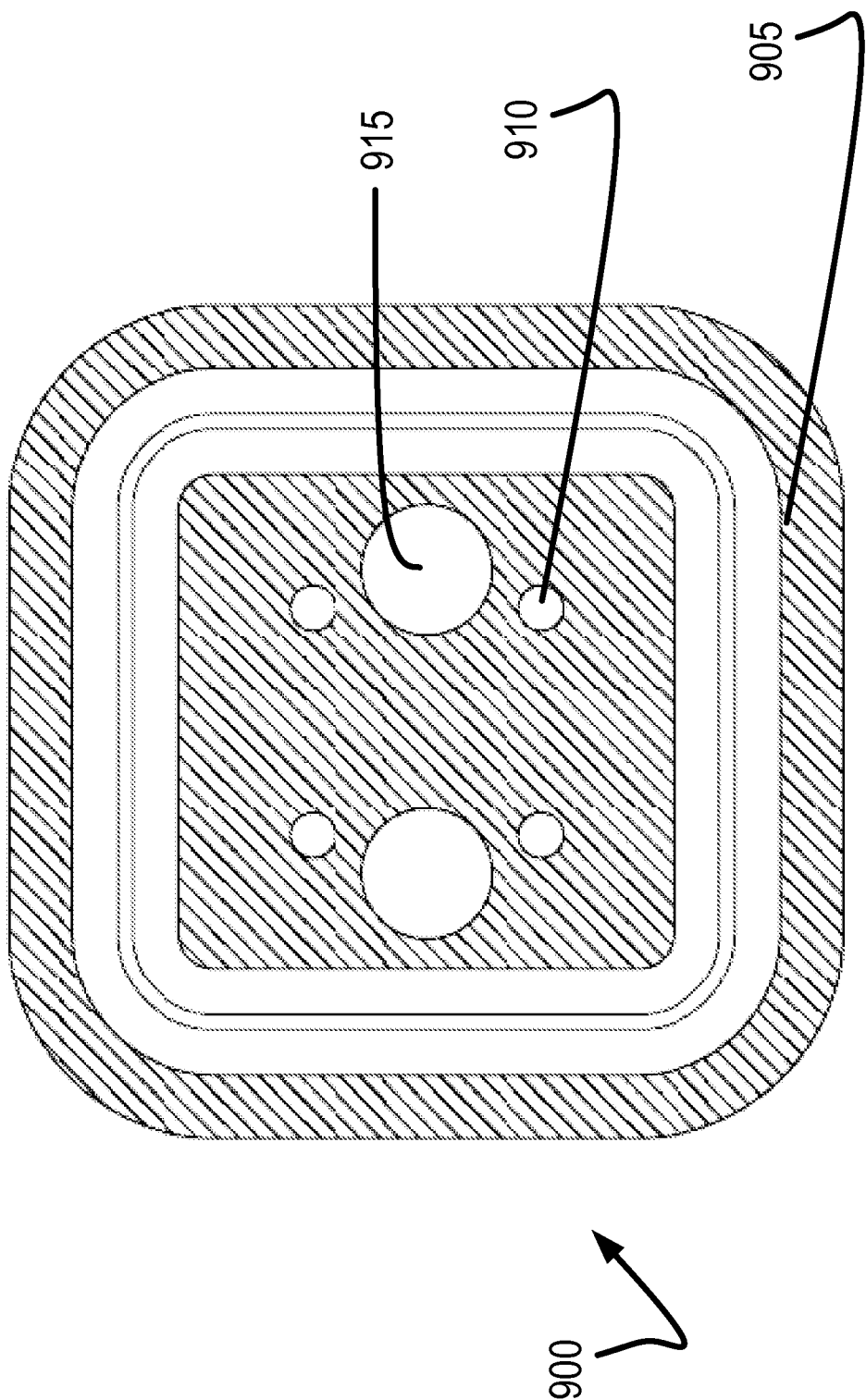
FIG. 8 depicts an example wicking material that could be used in a heat removal assembly, in accordance with various embodiments.

In a specific example, a heat removal assembly such as heat removal assembly 200 may include a leaf spring such as leaf spring 530. FIG. 8 depicts a wicking material such as a mesh plate 900 that could be positioned between the leaf spring and a bellows such as bellows 210. Specifically, the mesh plate 900 may be formed of a flexible copper material 905 that may allow the mesh plate to flex and allow the coolant to reach, and escape from, the bellows 210. In some embodiments, the mesh plate 900 may be bonded to the base 215 and the center of the bellows 210. In some embodiments, mesh plate 900 may not be bonded to the flexible portion of the bellows, thereby allowing the bellows to flex such that contact may be made between the lower stiffener 220 and a die, as described above.

In some embodiments, the mesh plate 900 may include one or more holes such as holes 910 that allow the mesh plate to mate with the half shears 810 of the leaf spring 530, as depicted above. In some embodiments, the mesh plate 900 may include one or more additional holes such as holes 915 that may be configured to receive or mate with a pin, screw, or some other type of stop post to help hold the mesh plate 900 in position within the heat removal assembly.

Figure 9:
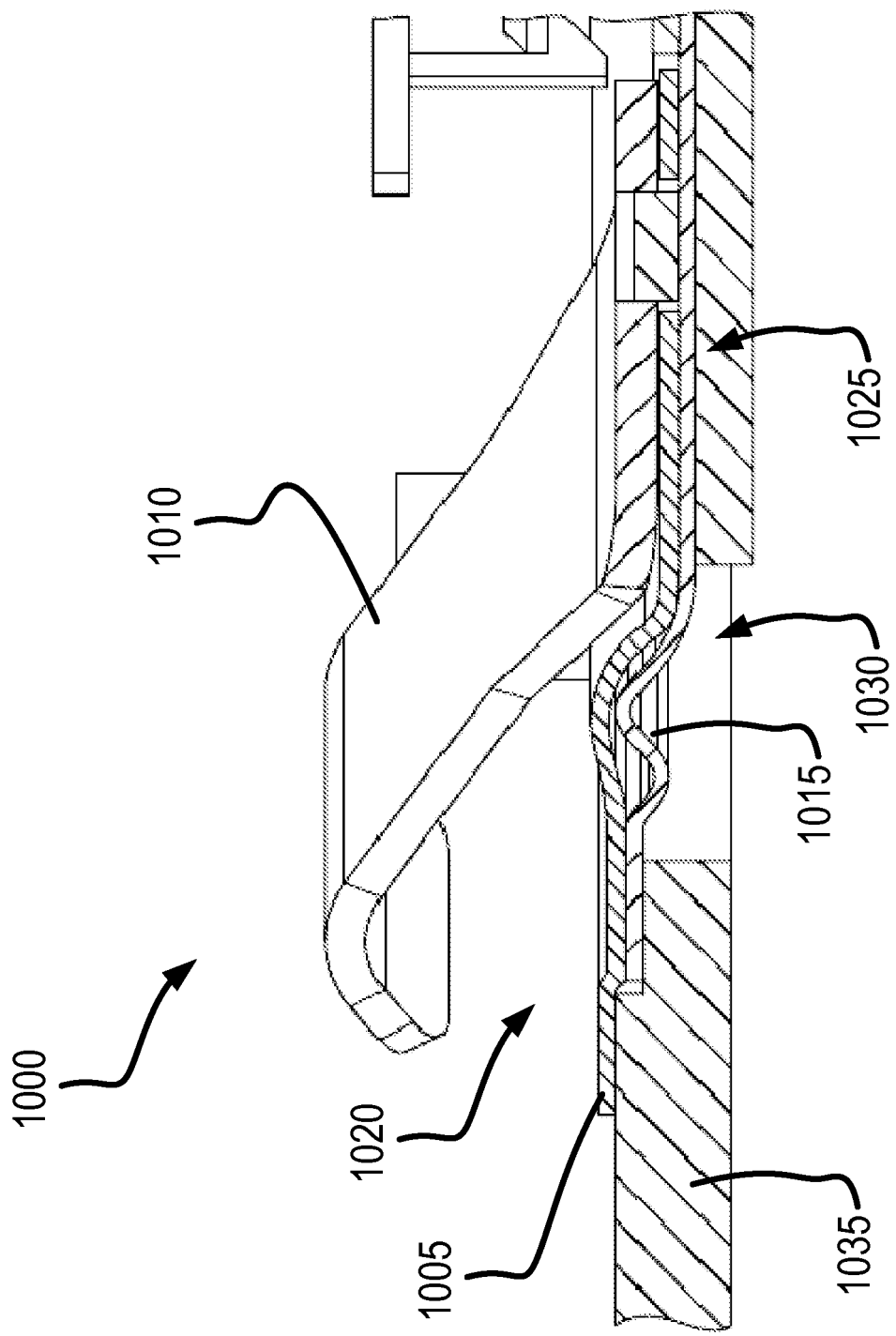
FIG. 9 depicts an example cut-away view of a heat removal assembly that includes the wicking material of FIG. 8, in accordance with various embodiments.

FIG. 9 depicts an example cross-section of a heat removal assembly 1000 that includes a mesh plate 1005 positioned between a leaf spring 1010 such as leaf spring 530 and a bellows 1015 such as bellows 210. As discussed above, the mesh plate 1005 may be bonded with the base 1035 such as base 215 at 1020. Similarly, the mesh plate 1005 may be bonded with the bellows 1015 at 1025. However, the mesh plate 1005 may not be bonded with a flexible part of the bellows 1015 at 1030, thereby allowing the bellows 1015 to flex and thermally couple with a die as described above.

Although only a portion of the mesh plate 1005 may be depicted in FIG. 9, this depiction is for the purpose of showing a detailed cross-section of the configuration of the heat removal assembly 1000. On a larger sale, generally it may be desirable for the mesh plate 1005 to generally cover the bellows 1015. For example, in some embodiments, the mesh plate 1005 may cover a substantial majority or all of the bellows 1015. Further the wicking material may be in contact with a substantial majority or all of the base 1035 such that the working fluid can move from the base 1035 to the bellows 1015.

In some embodiments, one or more of the heat removal assemblies 100, 200, 300, 400, 500, 600, etc. may include a bellows z-range limiter. The z-range limiter may limit the amount by which the bellows may extend from the various heat removal assemblies. An example heat removal assembly 1200 that includes a z-range limiter 1280 is depicted in FIG. 11.

The heat removal assembly 1200 may include a bellows 1215, leaf spring 1230, bellows lower stiffener 1220, and cover 1205, which may be respectively similar to bellows 510, leaf spring 530, bellows lower stiffener 520, and cover 505. The heat removal assembly 1200 may further include a z-range limiter 1280 that includes an upper z-range limiter 1285 and a lower z-range limiter 1290. As can be seen the lower z-range limiter 1290 may include one or more protrusions 1291, and be coupled with the bellows 1215, either directly or indirectly. The upper z-range limiter 1285 may likewise include one or more hook elements 1286 and be coupled with the cover 1205. As can be seen, the protrusions 1291 and hook elements 1286 may be sized such that the hook elements 1286 define a diameter or size that is less than the diameter of the protrusions 1291. Therefore, the lower z-range limiter 1290 may not be able to extend beyond a certain z-height of the upper z-range limiter 1285, because the hook elements 1286 may catch or stop the protrusions 1291. In this manner, the z-range of the bellows 1215 may be limited such that the bellows 1215 can not extend beyond a pre-defined z-height.

Figure 11:
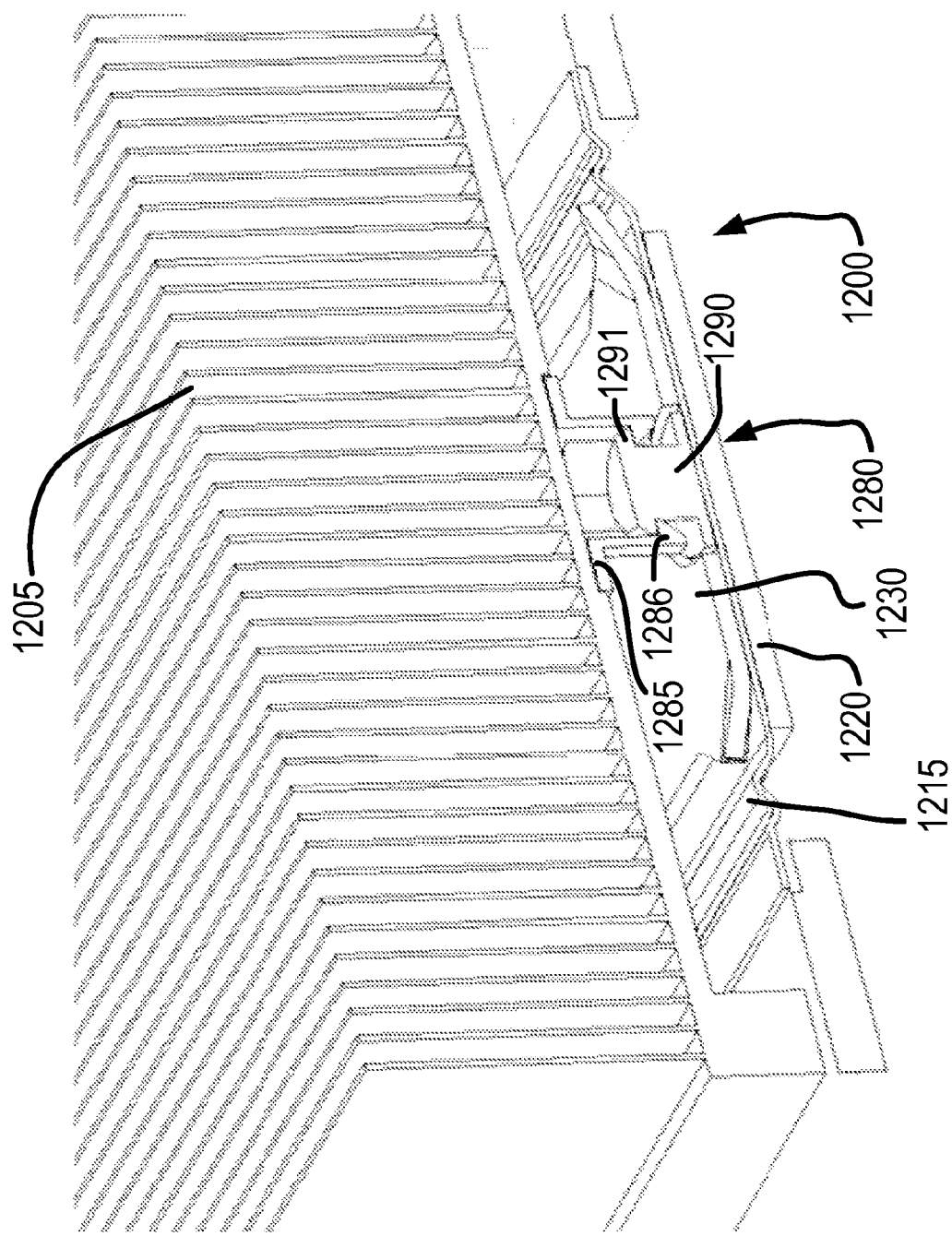
FIG. 11 depicts an example cut-away view of a heat removal assembly with a z-range limiter, in accordance with various embodiments.

It will be understood that the z-range limiter 1280 depicted in FIG. 11 is intended as an example of such a z-range limiter, and other embodiments may include different details or configurations. For example, in some embodiments the lower z-range limiter 1290 may include the hook elements 1286, and the upper z-range limiter 1285 may include the protrusions 1291. In other embodiments, some other type of stop or catch may be used in place of or in addition to the protrusions 1291 or the hooks 1286.

Although the z-range limiter 1280 is depicted as implemented in an embodiment of a heat removal assembly similar to heat removal assembly 500, in other embodiments the z-range limiter 1280 may be implemented in any of heat removal assemblies 100, 200, 300, 400, 500, 600, etc. described herein. In some embodiments, the z-range limiter 1280 may be implemented in addition to or instead of one or more of pins 335, 435, 635, etc. In some embodiments, the z-range limiter 1280 may be configured to be coupled or positioned with or in one or more of cold fin assemblies 545 or 645, leaf springs 530 or 1030, mesh plates 1005 or 905, or some other element such as leaf spring 230. Specifically, in some embodiments the z-range limiter 1280 may be positioned within one or more of holes 710, 910, or 915, or cutouts 815. Additionally, although the z-range limiter 1280 is described as coupled with a cover 1205 and the bellows 1215, in other embodiments either the upper or lower z-range limiter 1285 or 1290 may be coupled with some other element of one or more of the heat removal assemblies described above.

Figure 10:
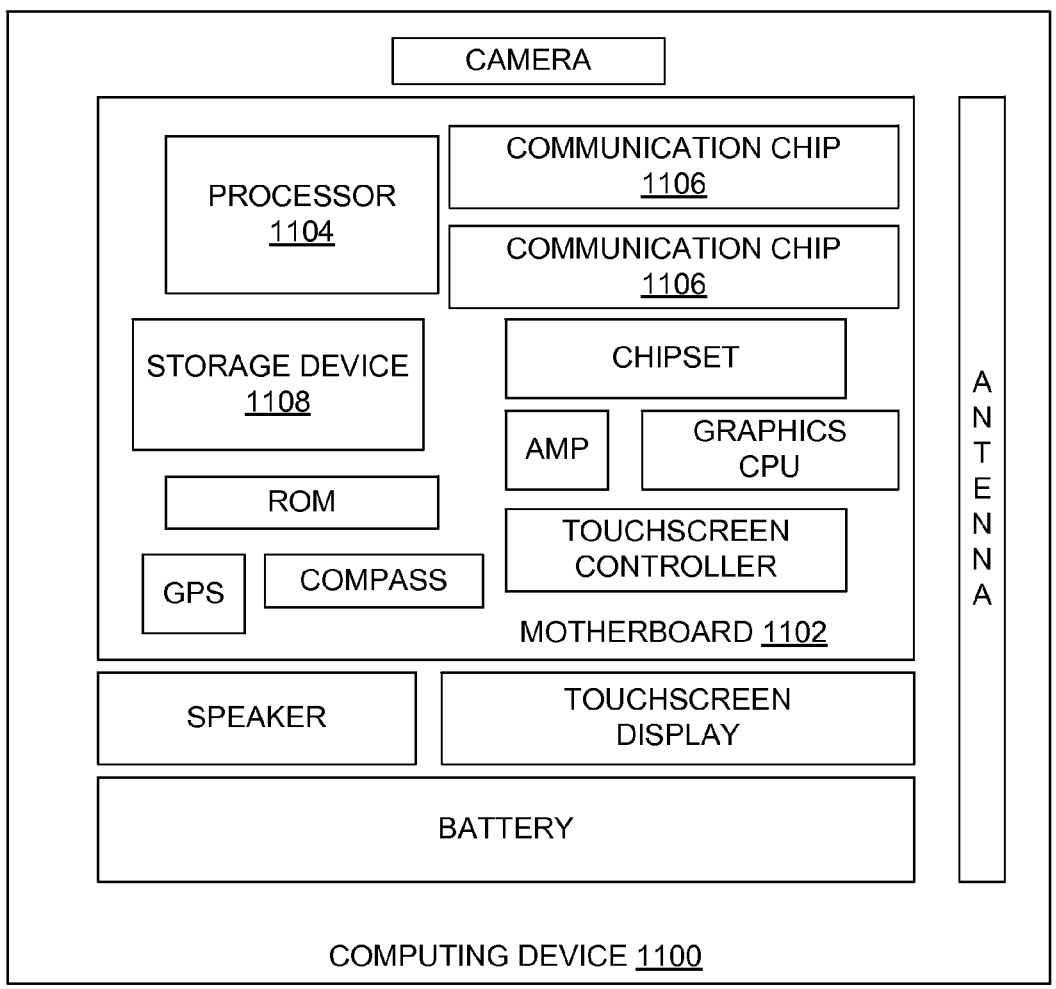
FIG. 10 schematically illustrates a computing device that may include a heat removal assembly, in accordance with various embodiments.

Embodiments of the present disclosure may be implemented into a system using the packages and manufacturing techniques disclosed herein. FIG. 10 schematically illustrates a computing device 1100, in accordance with some implementations, which may include one or more heat removal assemblies such as the heat removal assemblies 100, 200, 300, 400, 500, 600, etc. described herein.

The computing device 1100 may be, for example, a mobile communication device or a desktop or rack-based computing device. The computing device 1100 may house a board such as a motherboard 1102. The motherboard 1102 may include a number of components, including (but not limited to) a processor 1104 and at least one communication chip 1106. Any of the components discussed herein with reference to the computing device 1100 may include a heat removal assembly as described above.

The computing device 1100 may include a storage device 1108. In some embodiments, the storage device 1108 may include one or more solid state drives. Examples of storage devices that may be included in the storage device 1108 include volatile memory (e.g., dynamic random access memory (DRAM)), non-volatile memory (e.g., read-only memory, ROM), flash memory, and mass storage devices (such as hard disk drives, compact discs (CDs), digital versatile discs (DVDs), and so forth).

Depending on its applications, the computing device 1100 may include other components that may or may not be physically and electrically coupled to the motherboard 1102. These other components may include, but are not limited to, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

The communication chip 1106 and the antenna may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wide region (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1106 may operate in accordance with a Global System for Mobile Communications (GSM), General Packet Radio Service (GPRS), Universal Mobile Telecommunications System (UMTS), High Speed Packet Access (HSPA), Evolved HSPA (E-HSPA), or LTE network. The communication chip 1106 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1106 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1106 may operate in accordance with other wireless protocols in other embodiments.

The computing device 1100 may include a plurality of communication chips 1106. For instance, a first communication chip 1106 may be dedicated to shorter range wireless communications such as Wi-Fi and Bluetooth, and a second communication chip 1106 may be dedicated to longer range wireless communications such as GPS, EDGE, GPRS, CDMA, WiMAX, LTE, EV-DO, and others. In some embodiments, the communication chip 1106 may support wired communications. For example, the computing device 1100 may include one or more wired servers.

The processor 1104 and/or the communication chip 1106 of the computing device 1100 may include one or more dies or other components in an IC package. Such an IC package may be coupled with an interposer or another package using any of the techniques disclosed herein. The term "processor" may refer to any device or portion of a device that processes electronic data from registers and/or memory to transform that electronic data into other electronic data that may be stored in registers and/or memory.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data. In some embodiments, the recessed conductive contacts disclosed herein may be implemented in a high-performance computing device.

The following paragraphs provide examples of various ones of the embodiments disclosed herein.

Example Set 1

According to various embodiments, the present disclosure describes an apparatus. Example 1 of an apparatus may include a heat removal assembly having two or more surfaces configured to thermally couple with respective surfaces of two or more dies and bellows configured to automatically adjust a position of at least one surface of the two or more surfaces relative to another surface of the two or more surfaces. Example 2 may include the apparatus of Example 1, wherein the adjusted position is to compensate for a height difference between a first die and a second die of the two or more dies. Example 3 may include the apparatus of any of Examples 1-2, wherein the bellows are coupled with a spring assembly to automatically adjust the position of the at least one surface. Example 4 may include the apparatus of any of Examples 1-3, wherein the heat removal assembly comprises a vapor chamber and the two or more surfaces are surfaces on the vapor chamber. Example 5 may include the apparatus of Example 4, wherein the heat removal assembly further comprises a heat sink element coupled with the vapor chamber. Example 6 may include the apparatus of any of Examples 1-3, wherein the two or more surfaces comprise a metal such as copper.

According to various embodiments, the present disclosure describes another apparatus. Example 7 of an apparatus may include a multi-chip package assembly coupled with the apparatus of any of examples 1-3. Example 8 of the apparatus may include the apparatus of Example 7, wherein the multi-chip package assembly includes a first die and a second die mounted on a package substrate and wherein the first die has a height that is greater or less than a height of the second die relative to a surface of the package substrate upon which the first die and the second die are mounted.

According to various embodiments, the present disclosure describes a system (e.g., a computing device). Example 9 of a system may include a circuit board, a plurality of dies mounted on the circuit board, and a heat removal assembly having two or more surfaces configured to thermally couple with respective surfaces of two or more dies of the plurality of dies and bellows configured to automatically adjust a position of at least one surface of the two or more surfaces relative to another surface of the two or more surfaces.

Example Set 2

Example 1 may include a heat removal assembly comprising: two or more surfaces to thermally couple with respective surfaces of two or more dies; and bellows to automatically adjust a position of at least one surface of the two or more surfaces relative to another surface of the two or more surfaces.

Example 2 may include the heat removal assembly of example 1, further comprising a vapor chamber, and the two or more surfaces are surfaces of the vapor chamber.

Example 3 may include the heat removal assembly of example 2, further comprising a heatsink element coupled with the vapor chamber.

Example 4 may include the heat removal assembly of example 1, wherein the heat removal assembly includes a cold plate assembly.

Example 5 may include the heat removal assembly of any of examples 1-4, further comprising a spring assembly coupled with the bellows, the spring assembly to adjust the position of the at least one surface.

Example 6 may include the heat removal assembly of example 5, wherein the spring assembly includes a coil spring or a leaf spring.

Example 7 may include the heat removal assembly of example 5, further comprising a wicking material between the bellows and the spring assembly.

Example 8 may include a multi-chip package assembly that includes a first die and a second die mounted on a package substrate, wherein the first die has a height that is greater or less than a height of the second die relative to a surface of the package substrate; and a heat removal assembly coupled with the first die and the second die, the heat removal assembly comprising: a first surface and a second surface to thermally couple with respective surfaces of the first die and the second die; and bellows to automatically adjust a position of the first surface or the second surface based on the height of the first die or the second die.

Example 9 may include the multi-chip package assembly of example 8, wherein the heat removal assembly further includes a vapor chamber, and the first surface and the second surface are surfaces of the vapor chamber.

Example 10 may include the multi-chip package assembly of example 9, wherein the heat removal assembly further includes a heatsink element coupled with the vapor chamber.

Example 11 may include the multi-chip package assembly of example 8, wherein the heat removal assembly further includes a cold plate assembly.

Example 12 may include the multi-chip package assembly of any of examples 8-11, wherein the heat removal assembly further includes a spring assembly coupled with the bellows, the spring assembly to adjust the position of the first surface or the second surface.

Example 13 may include the multi-chip package assembly of example 12, wherein the spring assembly includes a coil spring or a leaf spring.

Example 14 may include the multi-chip package assembly of example 12, further comprising a wicking material between the bellows and the spring assembly.

Example 15 may include a system comprising: a circuit board; a plurality of dies coupled with the circuit board; and a heat removal assembly coupled with a first die and a second die of the plurality of dies, the heat removal assembly comprising: a first surface and a second surface to thermally couple with respective surfaces of two of the plurality of dies; and bellows to automatically adjust a position of the first surface respective to the second surface based on a height of the first die relative to a height of the second die measured from the circuit board.

Example 16 may include the system of example 15, wherein the heat removal assembly further includes a vapor chamber, and the first surface and the second surface are surfaces of the vapor chamber.

Example 17 may include the system of example 16, wherein the heat removal assembly further includes a heatsink element coupled with the vapor chamber.

Example 18 may include the system of example 15, wherein the heat removal assembly further includes a cold plate assembly.

Example 19 may include the system of any of examples 15-18, wherein the heat removal assembly further includes a spring assembly coupled with the bellows, the spring assembly to adjust the position of the first surface or the second surface.

Example 20 may include the system of example 19, wherein the spring assembly includes the coil spring or the leaf spring.

Example 21 may include the system of example 19, further comprising a wicking material between the bellows and the spring assembly.

What is claimed is:

1. A heat removal assembly comprising:
    a vapor chamber that includes two or more surfaces to thermally couple with respective surfaces of two or more dies; and
    bellows coupled to a first surface of the two or more surfaces to automatically adjust a position of the first surface to be at a different plane in relation to a second surface of the two or more surfaces.

2. The heat removal assembly of claim 1, wherein the bellows is to flex as pressure is increased within the vapor chamber.

3. The heat removal assembly of claim 1, further comprising a heatsink element coupled with the vapor chamber.

4. The heat removal assembly of claim 1, wherein the heat removal assembly includes a cold plate assembly.

5. The heat removal assembly of claim 1, further comprising a spring assembly coupled with the bellows, the spring assembly to adjust the position of at least one surface.

6. The heat removal assembly of claim 5, wherein the spring assembly includes a coil spring or a leaf spring.

7. The heat removal assembly of claim 5, further comprising a wicking material between the bellows and the spring assembly.

8. A multi-chip package assembly that includes a first die and a second die mounted on a package substrate, wherein the first die has a height that is greater or less than a height of the second die relative to a surface of the package substrate; and
    a heat removal assembly coupled with the first die and the second die, the heat removal assembly comprising:
        a vapor chamber that includes a first surface and a second surface to thermally couple with respective surfaces of the first die and the second die; and
        bellows coupled to the first surface to automatically adjust a position of the first surface to be at a different plane in relation to the second surface based on the height of the first die or the second die.

9. The multi-chip package assembly of claim 8, wherein the bellows is to flex as pressure is increased within the vapor chamber.

10. The multi-chip package assembly of claim 8, wherein the heat removal assembly further includes a heatsink element coupled with the vapor chamber.

11. The multi-chip package assembly of claim 8, wherein the heat removal assembly further includes a cold plate assembly.

12. The multi-chip package assembly of claim 8, wherein the heat removal assembly further includes a spring assembly coupled with the bellows, the spring assembly to adjust the position of the first surface or the second surface.

13. The multi-chip package assembly of claim 12, wherein the spring assembly includes a coil spring or a leaf spring.

14. The multi-chip package assembly of claim 12, further comprising a wicking material between the bellows and the spring assembly.

15. A system comprising:
   a circuit board;
   a plurality of dies coupled with the circuit board; and
   a heat removal assembly coupled with a first die and a second die of the plurality of dies, the heat removal assembly comprising:
      a vapor chamber that includes a first surface and a second surface to thermally couple with respective surfaces of two of the plurality of dies; and
      bellows coupled to the first surface to automatically adjust a position of the first surface to be at a different plane in relation to the second surface based on a height of the first die relative to a height of the second die measured from the circuit board.

16. The system of claim 15, wherein the bellows is to flex as pressure is increased within the vapor chamber.

17. The system of claim 15, wherein the heat removal assembly further includes a heatsink element coupled with the vapor chamber.

18. The system of claim 15, wherein the heat removal assembly further includes a cold plate assembly.

19. The system of claim 15, wherein the heat removal assembly further includes a spring assembly coupled with the bellows, the spring assembly to adjust the position of the first surface or the second surface.

20. The system of claim 19, wherein the spring assembly includes a coil spring or a leaf spring.

21. The system of claim 19, further comprising a wicking material between the bellows and the spring assembly.

\* \* \* \* \*